(12) United States Patent
Hiller

(10) Patent No.: US 10,009,119 B1
(45) Date of Patent: Jun. 26, 2018

(54) BANDGAP MODULATION FOR UNDERWATER COMMUNICATIONS AND ENERGY HARVESTING

(71) Applicant: The Boeing Company, Chicago, IL (US)

(72) Inventor: Nathan D. Hiller, Irvine, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days. days.

(21) Appl. No.: 15/451,272

(22) Filed: Mar. 6, 2017

(51) Int. Cl.
*H04B 13/02* (2006.01)
*H04B 10/80* (2013.01)

(52) U.S. Cl.
CPC ........... *H04B 13/02* (2013.01); *H04B 10/808* (2013.01)

(58) Field of Classification Search
CPC  H01L 2924/00; G01N 15/1484; G01N 15/14; G01N 15/1434; G01N 15/147; G01N 35/00871; G01N 21/3577; G01N 21/532; G01N 15/0205
USPC ...................................................... 398/104
See application file for complete search history.

(56) References Cited

U.S. PATENT DOCUMENTS

| 4,050,819 | A | 9/1977 | Lichtman |
| 8,174,242 | B2 | 5/2012 | Imai |
| 8,346,415 | B1 | 1/2013 | Hinnant, Jr. |
| 9,503,199 | B2 | 11/2016 | Hiller |
| 2007/0247607 | A1* | 10/2007 | Shibazaki ........... G03F 7/70341 355/72 |
| 2008/0289420 | A1 | 11/2008 | Cochran et al. |
| 2011/0178578 | A1 | 7/2011 | Porat et al. |
| 2014/0016558 | A1 | 1/2014 | Lawry et al. |
| 2015/0049587 | A1 | 2/2015 | Lawry et al. |
| 2015/0138920 | A1 | 5/2015 | Hiller |

(Continued)

FOREIGN PATENT DOCUMENTS

| GB | 2 399 921 | 9/2004 |
| WO | WO 2013/148464 | 10/2013 |
| WO | WO 2016/104602 | 6/2016 |

OTHER PUBLICATIONS

Akyildiz et al., "Challenges for Efficient Communication in Underwater Acoustic Sensor Networks," ACM Sigbed Review, 2004, 6 pages.

(Continued)

*Primary Examiner* — Don N Vo
(74) *Attorney, Agent, or Firm* — Womble Bond Dickinson (US) LLP

(57) ABSTRACT

A system is provided that includes a gateway node and terminal node. The gateway node includes an actuator configured to produce a light beam for propagation through a fluid, and a sensor configured to detect a reflection of the light beam. The terminal node is disposed within the fluid and includes an energy source and a photovoltaic layer adjacent to a reflective layer. The photovoltaic layer is switchably controlled between two modes, to convey a data stream associated with the reflected light beam to the sensor of the gateway node, the two modes including: a transmission mode wherein the light beam is transmitted through the photovoltaic layer and reflected by the adjacent reflective layer to the sensor of the gateway node, and a recharging mode wherein the photovoltaic layer is configured to capture photonic energy from the light beam for storage in the energy source.

21 Claims, 6 Drawing Sheets

(56) References Cited

U.S. PATENT DOCUMENTS

2015/0286340 A1* 10/2015 Send .................. G01S 17/46
                                                        345/175
2018/0007343 A1* 1/2018 Send .................. H04N 13/0217

OTHER PUBLICATIONS

Akyildiz et al., "Underwater Acoustic Sensor Networks: Research Challenges," Ad Hoc Networks 3, 2005, pp. 257-279.
Audoly, "Review of Active Methods for Acoustic Echo Cancellation," SPIE vol. 1916, 1993, pp. 156-167.
Bereketli, "Remotely Powered Underwater Acoustic Sensor Networks," A Thesis Submitted to The Graduate School of Natural and Applies Sciences of Middle East Technical University, May 2013, 90 pages.
"Captain Nemo goes online," The Economist Technology Quarterly, Mar. 9, 2013, 2 pages.
Chitre et al., "Underwater Acoustic Communications and Networking: Recent Advances and Future Challenges," Marine Technology Society Journal, Spring 2008, vol. 42, No. 1, pp. 103-116.
Darner et al., "Ultrasonic Shutter," The Journal of the Acoustical Society of America, Sep. 1955, vol. 27, No. 5, pp. 908-912.
Freitag et al., "The WHOI Micro-Modem: An Acoustic Communications and Navigation Systems for Multiple Platforms," in IEEE Oceans Conference, Washington, DC, 2005, 7 pages.
Guyomar et al., "Wave Reflection Control Using Switched Piezoelements," Proceedings International Congress on Acoustics, 2004, Tu4.E.5, pp. II-1291-II-1294.
Harris et al., "When Underwater Acoustic Nodes Should Sleep With One Eye Open: Idle-time Power Management in Underwater Sensor Networks," 2006, WUWNet '06, Los Angeles, California, 4 pages.
Kintisch, "A Sea Change for U.S. Ocaenography," SCIENCE, vol. 339, Mar. 8, 2013, pp. 1138-1143.
Lafleur et al., "Acoustically Active Surfaces Using Piezorubber," The Journal of the Acoustical Society of America 90 (3), Sep. 1991, pp. 1230-1237.
Nagy, "Introduction to Ultrasonics, 20-251-728," 2001, 40 pages.
Nagy, "Reflection and Transmission of Ultrasonic Waves," 2001, 27 pages.
Sozer, "Underwater Acoustic Networks," IEEE Journal of Oceanic Engineering, vol. 25, No. 1, Jan. 2000, pp. 72-83.
Stojanovic et al., "Underwater Acoustic Commnunication Channels: Propagation Models and Statistical Characterization," IEEE Communications Magazine, Jan. 2009, pp. 84-89.
Wills et al., "Low-Power Acoustic Modem for Dense Underwater Sensor Networks," 2006, WUWNet '06, Los Angeles, California, 7 pages.
Zhang et al., "Passive Underwater Acoustic Damping Using Shunted Piezoelectric Coatings," Institute of Physics Publishing, Smart Materials and Structures 10, 2001, pp. 414-420.
Great Britain Search and Examination Report dated May 18, 2015 for Application No. GB1420422.6.
Sanchez, A., et al., "A low cost and high efficient acoustic modem for underwater sensor networks," 2011, IEEE, Spain, XP032040252.
Roul, S., et al., "Coastal surveillance networks using AVS and blue green lasers," IEEE Underwater Technology (UT), Feb. 23, 2015, pp. 1-7. XP032777087.
Zeng, Z., et al., "A Survey of Underwater Optical Wireless Communications," IEEE Communications Surveys & Tutorials, vol. 19(1), Feb. 22, 2017, pp. 204-238. XP011641675.

\* cited by examiner

BANDGAP MODULATION FOR UNDERWATER COMMUNICATIONS AND ENERGY HARVESTING

TECHNOLOGICAL FIELD

The present disclosure relates generally to underwater communication and, in particular, to bandgap modulation for underwater communications and energy harvesting.

BACKGROUND

Despite covering 70% of the earths' surface, little is known about the subsea environment. Its nearly-impermeable communication medium and great pressures make accessing subsea information a daunting challenge.

Subsea optical communication systems could soon be used to provide widespread information about the subsea environment. Thousands of small self-powered optical nodes dropped out of a plane could carpet the ocean floors making the subsea environment abundant with accessible information.

The greatest challenge for vast subsea networks is the limited battery power of each optical node. Remotely powering these nodes is possible but power transfer is limited. The core problem is the high power required by these nodes during data transmission. For example, a typical node only consumes as low as $10^{-4}$ mW in the listening state (or polling state), but consumes between 1 and 100 mW during transmission.

Therefore, it would be desirable to have a system, apparatus and method that takes into account at least some of the issues discussed above, as well as possibly other issues.

BRIEF SUMMARY

Example implementations of the present disclosure are generally directed to an information collection system, a terminal node, and a related method that utilize bandgap modulation for underwater communications, and/or for energy harvesting. According to one example, a system is provided that includes a gateway node including an actuator configured to produce a light beam for propagation through a fluid, and a sensor configured to detect a reflection of the light beam; and a terminal node disposed within the fluid and including an energy source and a photovoltaic layer adjacent to a reflective layer, the terminal node comprising a control unit configured to switchably control the photovoltaic layer between two modes, in response to interaction with the light beam, to convey a data stream associated with the reflected light beam to the sensor of the gateway node, the two modes including: a transmission mode wherein the light beam incident on the photovoltaic layer is transmitted therethrough to and reflected by the adjacent reflective layer to the sensor of the gateway node, and a recharging mode wherein the photovoltaic layer is configured to capture photonic energy from the light beam and to direct the captured photonic energy for storage by the energy source, without reflecting the light beam, at least a portion of the terminal node being powerable from the photonic energy stored by the energy source.

According to another example, a terminal node comprises an energy source configured to store photonic energy and to power at least a portion of the terminal node from the photonic energy stored thereby; a reflective layer configured to reflect a light beam propagating through a fluid; a photovoltaic layer adjacent to the reflective layer; and a control unit in electrical communication with the photovoltaic layer to switchably control the photovoltaic layer between two modes, in response to interaction with the light beam, to convey a data stream associated with the reflected light beam to a sensor of a gateway node, the two modes including: a transmission mode wherein the light beam incident on the photovoltaic layer is transmitted therethrough to and reflected by the adjacent reflective layer to the sensor of the gateway node, and a recharging mode wherein the photovoltaic layer is configured to capture the photonic energy from the light beam and to direct the captured photonic energy for storage by the energy source, without reflecting the light beam.

According to a further example, a method comprises receiving a light beam propagated through a fluid, the light beam being incident on a photovoltaic layer of a terminal node disposed within the fluid; and switchably controlling the photovoltaic layer between two modes, in response to interaction with the light beam, to convey a data stream associated with the reflected light beam to a sensor of a gateway node, the two modes including: a transmission mode, wherein the light beam incident on the photovoltaic layer is transmitted therethough to the reflective layer for reflection thereby, and wherein the reflected light beam is directed back through the photovoltaic layer to the sensor of the gateway node, and a recharging mode wherein the photovoltaic layer is configured to capture photonic energy from the light beam and to direct the captured photonic energy for storage by an energy source, without reflecting the light beam, and wherein at least a portion of the terminal node is powerable from the photonic energy stored by the energy source.

The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
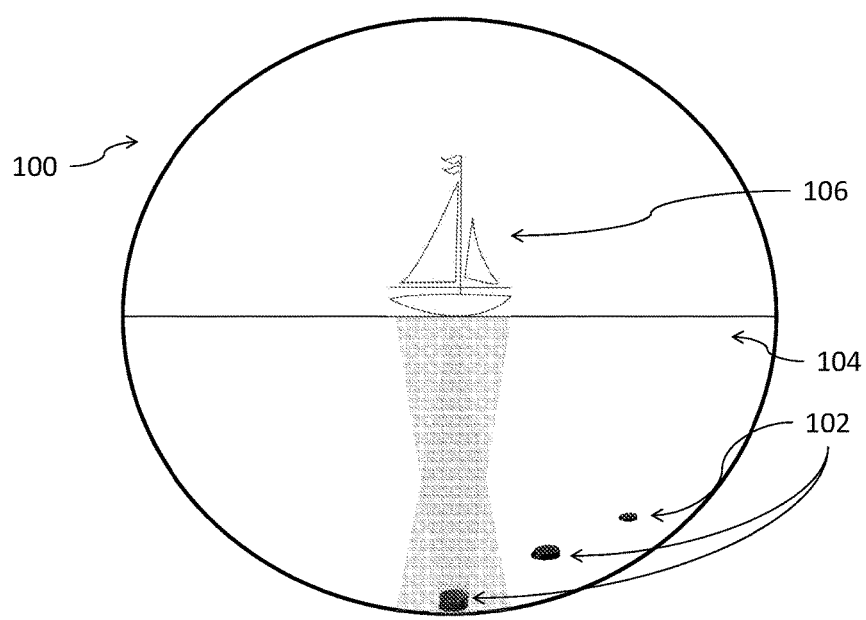
FIGS. 1 and 2 illustrate systems according to example implementations of the present disclosure.

Some implementations of the present disclosure will now be described more fully hereinafter with reference to the accompanying drawings, in which some, but not all variations of the disclosure are shown. Indeed, variations of the disclosure may be embodied in many different forms and should not be construed as limited to the examples set forth herein; rather, these are provided so that this disclosure will be thorough and complete, and will fully convey the scope of the disclosure to those skilled in the art.

Examples are described with reference to underwater communications and/or energy harvesting, such as in the context of ocean, river or stream current. It should be understood, however, that examples are equally applicable to the communication and energy harvesting in other fluids. Further, for example, reference is made herein to values of or relationships between components, parameters, properties, variables or the like. These and other similar values or relationships are absolute or approximate to account for variations that may occur, such as those due to engineering tolerances or the like. Like reference numerals refer to like elements throughout.

FIG. 1 illustrates a system 100 according to one example of the present disclosure. In some aspects, for example, the system includes one or more terminal nodes 102 such as sensors, which are deployable underneath the surface of a body of water 104 such as an ocean, river or stream. The terminal nodes, in some aspects, form an underwater local area network (UW-LAN), which is connectable to other networks including wired or wireless networks, other UW-LANs and the like, via one or more gateway nodes 106. These gateway nodes 106 include, for example, any of a number of different types of watercraft, buoys or the like, which are deployable on or only partially beneath the surface of the body of water 104, or are capable of moving between the surface and beneath the surface of the body of water 104. Examples of suitable watercraft include boats, ships, hovercraft, underwater vehicles (e.g., submarines) and the like. Furthermore, in some aspects, there is more than one gateway node 106 such as a chain of unmanned underwater vehicles (UUVs) that relay data to the surface of the body of water 104.

Other examples of suitable gateway nodes 106 include those deployed over the surface of the body of water 104, or over or on the ground. Examples of such a gateway node 106 are aircraft, satellites or the like, which are coupled to or otherwise part of one or more networks, such as the Internet, public switched telephone networks (PSTN), and/or other servers and services.

Figure 2:
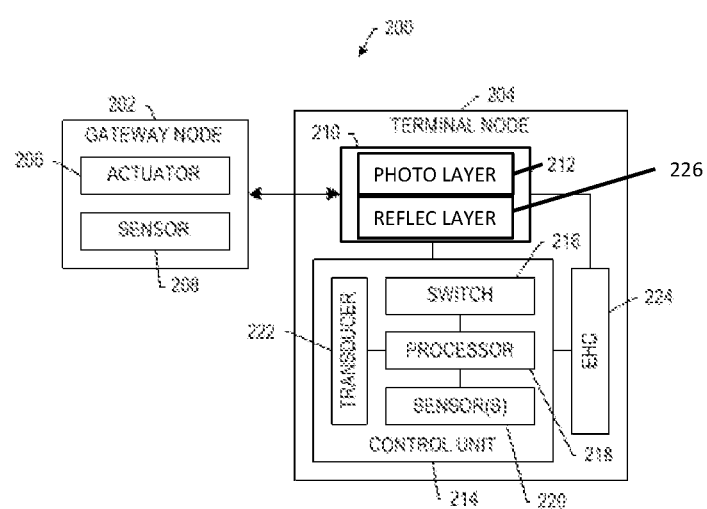

FIG. 2 more particularly illustrates a system 200 including a gateway node 202 and a terminal node 204, which in some examples correspond to a gateway node 106 and terminal node 102 of the system 100 of FIG. 1. As shown, the gateway node 202 includes an actuator 206 configured to produce a light beam for propagation through a fluid such as water, and a sensor 208 configured to detect a reflection of the light beam. In some examples, separate transducers provide the functions of the actuator 206 and sensor 208, or in other examples, a combination transducer provides the functions of both the actuator 206 and sensor 208.

In accordance with example implementations, a light beam refers to a light beam of constant or near-constant wavelength. For example, in one aspect, the light beam is produced from a low-power laser emitting a light beam comprising a wavelength of between about 470 and about 540 nanometers and transmitting modulated data at a rate of between 10 and about 250 megabits per second (Mbps). In some examples, a continuous light beam also refers to such a light beam in which the gateway node 202 at one or more instances (e.g., continuously, periodically) changes the light beam frequency so as to account for the Doppler Effect that results from a velocity difference between the mobile gateway node 202 and the stationary terminal node 204.

The terminal node 204 includes, in some aspects, an interface structure 210 with a photovoltaic layer 212, which in some examples is formed of a crystalline silicon, a cadmium telluride film material, etc. In some aspects, the photovoltaic layer 212 is a commercially available solar cell, while in other aspects, the photovoltaic layer 212 is an optimized photodiode having a minimized impedance and a minimized reverse leakage current resulting from reverse bias matching impedances. In other aspects, the photovoltaic layer 212 comprises a charge-coupled device (CCD) camera capable of detecting the light beam for high speed communications between the gateway node 202 and the terminal node 204.

The terminal node 204 is configured to switchably control the photovoltaic layer 212 between two modes, in response to interaction with the light beam, to convey a data stream associated with the reflected light beam to the sensor of the gateway node 202. In some aspects, the photovoltaic layer 212 is switchably controlled to a transmission mode, wherein the light beam incident on the photovoltaic layer 212 is transmitted therethrough to and reflected by an adjacent reflective layer 226 to the sensor 208 of the gateway node 202. In other aspects, the photovoltaic layer 212 is switchably controlled to a recharging mode wherein the photovoltaic layer 212 is configured to capture photonic energy from the light beam and to direct the captured photonic energy for storage by an energy source 224, without reflecting the light beam, wherein at least a portion of the terminal node 204 is powerable from the photonic energy stored by the energy source 224.

In some aspects, the data stream conveyed within the reflected light beam during the transmission mode is a bit stream including a series of bits. For example, a reflection of the light beam from the terminal node 204 represents a binary "1" of the bit stream, and a nominal, if not null, reflection (i.e., absorption) of the light beam represents a binary "0" of the bit stream. In other examples, a reflection of the light beam from the terminal node 204 represents a binary "0," and a nominal, if not null, reflection (i.e., absorption) of the light beam represents a binary "1." In other aspects, the data stream is conveyed by modulating M/T bits per second, where M is a number of bits and T is a number of seconds as per pulse-position modulation (PPM). For example, in this instance, the data stream is conveyed by modulating two bits per second.

In some aspects, the terminal node 204 includes a control unit 214 configured to switchably control the photovoltaic layer 212 between the two modes. The control unit 214 in turn includes a switch 216 and a processor 218. The switch 216, in some aspects, is in electrical communication (e.g., electrically connected) to opposing surfaces of the photovoltaic layer 212, and switchably controllable to electrically disconnect or connect the surfaces. In some aspects, electrically disconnecting or connecting the surfaces includes applying a voltage bias across the surfaces of the photovoltaic layer 212. In this manner, the processor 218 is configured to control the switch 216 to apply a voltage, or to remove the voltage, to control the photovoltaic layer 212 to switchably reflect (voltage bias) or absorb (no voltage bias) the incident light beam.

In some examples, the switch 216 is a single-pole, single-throw (SPST) electrical or electromechanical switch, a single-pole, double-throw (SPDT) electrical or electromechanical switch or the like. The processor 218 is generally any piece of computer hardware that is capable of processing information, and in some examples, the processor 218 includes or otherwise is configured to communicate with a suitable non-transitory memory. In some examples, the processor 218 is capable of processing information such as, for example, data, computer-readable program code, instructions and the like (generally "computer programs," e.g., software, firmware, etc.), and/or other suitable electronic information. More particularly, for example, the processor 218 is configured to execute computer programs, which are stored onboard the processor or otherwise stored in the non-transitory memory (of the same or another apparatus).

The processor 218 is, in some aspects, a number of processors, a multi-processor core or some other type of processor, depending on the particular implementation. Further, the processor 218 is implemented using a number of heterogeneous processor systems in which a main processor is present with one or more secondary processors on a single chip. As another illustrative example, the processor 218 is a symmetric multi-processor system containing multiple processors of the same type. In yet another example, the processor 218 is embodied as or otherwise includes one or more application-specific integrated circuits (ASICs), field-programmable gate arrays (FPGAs) and the like. Thus, although the processor 218 is capable of executing a computer program to perform one or more functions, the processor of various examples is capable of performing one or more functions without the aid of a computer program.

In some examples, the terminal node 204 further includes a sensor 220 in communication with the control unit 214, and configured to measure a property of an environment about the terminal node 204, and provide sensed data associated with the property. The sensor 220 is configured, in some aspects, to direct the sensed data to control unit 214 or the photovoltaic layer 212, wherein the photovoltaic layer 212 is controlled to carry the sensed data by modulating the reflected light beam. In these examples, the reflected light beam is modulated by the photovoltaic layer 212 according to the data stream to carry the sensed data to the sensor 220. Examples of suitable sensors include sensors capable of measuring one or more parameters of the water, wherein such parameters include salinity, conductivity, turbidity, acidity, oxygen, temperature, pressure, depth or the like. Other examples of suitable sensors include acoustic sensors, electromagnetic sensors, electric sensors, magnetic sensors, neutrino detectors and the like, as well as sensors capable of measuring sediment, pollution, sea floor vibrations for earthquake detection, and the like.

In some examples, the terminal node 204 further includes a transducer 222, or separate actuator and sensor, in communication with the control unit 214 and configured to produce a light beam for propagation through the fluid, and to detect a similar light beam. In this manner, the terminal node 204 is configured to communicate with other terminal nodes (e.g., terminal nodes 102, FIG. 1). For example, the terminal node 204 produces a light beam modulated with a data stream for broadcast to other terminal nodes, which detect the light beam and thereby the data stream conveyed by the modulated light beam. In one example, the transducer 222 extends around an outer perimeter of the terminal node 204, such as in the form of an annulus around an outer perimeter of a cylindrical-shaped terminal node, which facilitates radially-outward projection of the light beam toward other terminal nodes.

In some aspects, the terminal node 204 includes an energy harvesting circuit (EHC) 224 configured to capture and store at least a portion of photonic energy from the light beam interacting with the photovoltaic layer 212 when the photovoltaic layer is controlled to absorb or capture the incident light beam. In these examples, at least a portion of the terminal node 204 is powerable from the photonic energy stored by the EHC 224, such as at least a portion of the control unit 214. The EHC 224 generally includes, in some aspects, an energy accumulator such as a rechargeable battery or supercapacitor, and includes circuitry configured to perform an AC-to-DC conversion and/or voltage transformation, and which in some examples is optimized given properties of the photovoltaic layer 212 such as its electrical impedance, capacitance, frequency of vibration and the like. In some aspects, a capacitor is capable of bridging transfer time between the light beam and the EHC 224, such that the photonic energy is temporarily stored in the capacitor and used to 'trickle charge' a rechargeable battery of the EHC 224.

Figure 3A:
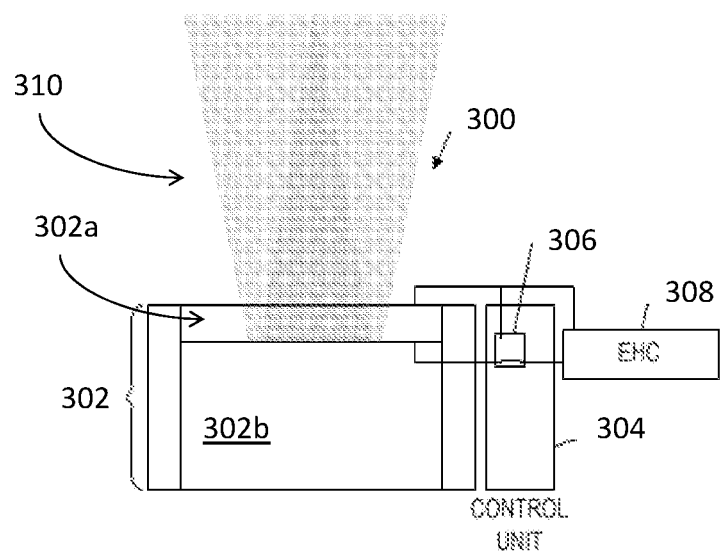
FIG. 3A illustrates a suitable arrangement of an interface structure and its connections to a suitable control unit having a switch in a first position and EHC, according to example implementations of the present disclosure.
Figure 3B:
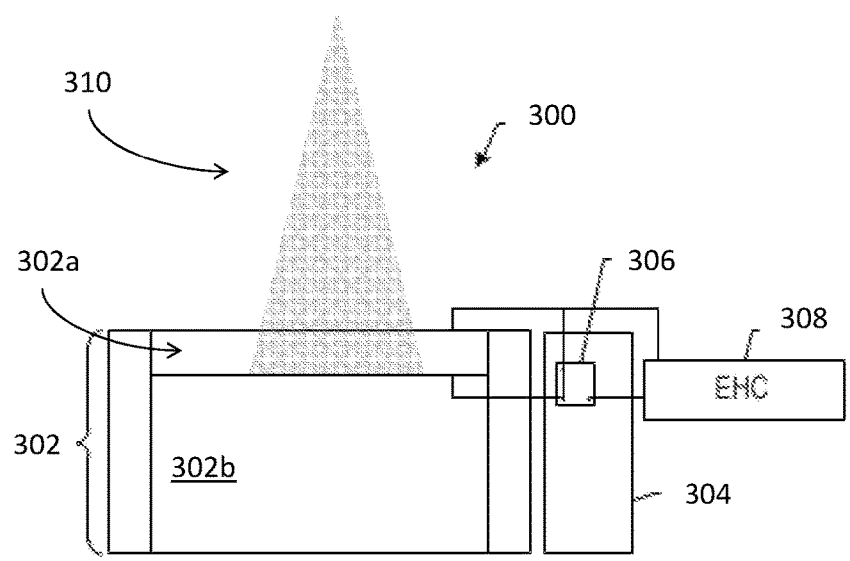
FIG. 3B illustrates the arrangement of FIG. 3A having the switch in a second position.

In some aspects, the interface structure 210 with its photovoltaic layer 212 is configured to be and is connected to the control unit 214 and EHC 224 in any of a number of manners. In some examples, the interface structure 210 or at least its photovoltaic layer 212 has a corner reflector (or retroreflector) form factor to facilitate reflection of an incident light beam in the same direction in which the light beam originated. In other examples, the interface structure 210 is a multilayered structure, including the photovoltaic layer 212 and one or more other layers. An example of a suitable arrangement of the interface structure and its connections to a suitable control unit and EHC is shown in FIGS. 3A and 3B.

Returning to FIG. 1, the system 100 of example implementations is beneficial for use in a number of different scenarios. In one example of a suitable scenario, a plurality of sensors (terminal nodes 102) are deployable on an ocean floor (body of water 104) to form strategic sensing lines, perimeters, rings or the like. These sensors are configured to record properties or data (sensed input) in its environment, such as the sound of passing underwater vehicles. A watercraft or UUV (gateway node 106) periodically passes over the sensors, transmitting a continuous light beam having a wavelength of about 532 nm to the ocean floor and thus to the sensors. In some aspects, the watercraft has a general knowledge of the location of the sensors on the ocean floor and/or uses dead reckoning to determine the location thereof. In some instances, the sensors are capable of transmitting a small beacon to facilitate location of the sensors by a passing watercraft.

In some aspects, the light beam is or becomes incident on the sensors, and in response to interaction with the light beams, the sensors switchably control their photovoltaic layers between two modes to convey a data stream associated with the reflected light beam to the sensor of the gateway node. In these instances, the two modes include a transmission mode where the light beam incident on the photovoltaic layer is reflected, or a recharging mode where the light beam incident on the photovoltaic layer is not reflected, and the photonic energy of the light beam is captured and directed to the EHC. In some of these instances, the reflected light beam is detectable back at the watercraft, or stored in rechargeable batteries of the EHC for at least partially powering the sensors.

In another example of a suitable scenario, the light beam produced by the watercraft has a wavelength of between about 10 nm and about 400 nm (i.e., ultraviolet spectrum) and is incident on the sensors in order to disturb formation of organic material on an external surface of the sensors. In this manner, for example, the light beam produced and emitted from the watercraft is controllably tuned between at least two different wavelengths.

In other exemplary implementations, sensors (terminal nodes 102) that acquire data communicate a notice to other sensors, such as by broadcasting unique identifiers of the respective sensors to neighboring sensors. For example, the sensors are configured to communicate with other sensors upon a detectable event (e.g., passing UUV). In another example, the sensors are configured to gather data over a period of time and then communicate with other sensors (e.g., fluid temperature detection). Regardless, the sensors that receive the notice repeat the broadcast to their neighboring sensors, and so forth, and communicate the notice up to the watercraft (gateway node 106) along with any of their own recorded data. In this manner, the watercraft is notified of particular sensors that have acquired data, and the watercraft is thus controlled to pass directly to those sensors, or pass over those sensors, more frequently.

In further exemplary implementations, the gateway node 106 is configured to communicate with one or more of the terminal nodes 102. For example, the gateway node in various instances produces a modulated light beam to thereby convey a data stream to a terminal node, instead of producing the continuous light beam. For example, the gateway node comprises a low-power laser configured to transmit a light beam modulated by quadrature phase shift keying (QPSK) to convey a data stream. The photovoltaic layer 212 of the terminal node is then controlled to detect the light beam from the gateway node 106 and process any instructions received from the conveyed data stream. For example, such instructions include what the terminal node 104 should detect based on certain triggering events, what data should be communicated to other gateway nodes, etc. Similarly, in some examples, the photovoltaic layer of the terminal node is controlled to more generally function as an optical sensor to detect and measure light beams in its environment, such as those from passing underwater vehicles as indicated above. In other instances, the terminal node includes another sensor (e.g., transducer 222) configured to detect the modulated light beam. The terminal node (e.g., processor 218) then appropriately demodulates the modulated light beam to extract the data stream from the gateway node.

Before describing the example arrangements, a brief explanation of the basic principle of operation of the photovoltaic layer 212 to reflect or absorb an incident light beam is provided. A light beam propagating through a fluid such as water reaches an interface of the fluid and surface of the photovoltaic layer 212 on which the light beam is incident.

In some aspects, the light beam incident on the photovoltaic layer 212 is transmitted therethrough to and reflected by an adjacent reflective layer 226. Such reflection of the light beam depends on a photonic energy of the light beam relative to a bandgap of a p-n junction of the photovoltaic layer 212. Notably, the bandgap of the p-n junction of the photovoltaic layer 212 changes accordingly as a wavelength of a light beam changes. For example, a wavelength of the light beam of about 532 nanometers corresponds to a bandgap of a p-n junction of the photovoltaic layer 212 of about 2.27 eV in an unbiased state. In other examples, however, wavelengths of the light beam of about 475 nm (e.g., clear ocean), 500 nm (e.g., polluted ocean), 532 nm (e.g., on coast), etc., each correspond to a bandgap of a p-n junction of the photovoltaic layer 212 in an unbiased state of a value other than 2.27 eV.

As referred to herein, a "p-n junction" is formed at an interface and immediate surroundings between an n-type surface and a p-type surface of the photovoltaic layer 212. The p-n junction is either biased or unbiased, depending on whether a voltage is applied across the p-n junction. In an unbiased state, the bandgap is a "built-in" bandgap based on a photonic energy difference between an outer electron or "conduction" band and a bottom or "valence" band. Conversely, in a biased or reverse biased state, the bandgap is increased where a voltage is applied across the p-n junction. In the reverse biased state, the p-n junction includes a bandgap having a higher photonic energy difference between the outer electron or conduction band and the bottom or valence band.

In some aspects, the bandgap of the p-n junction of the photovoltaic layer 212 is biased by selectively applying a voltage across thereto. More particularly, in a biased state, where a voltage of between about 0.1 volts and about 0.25 volts is applied across the p-n junction of the photovoltaic layer 212, the bandgap comprises about 2.37 eV. Conversely, in an unbiased state, where no voltage is applied across the p-n junction of the photovoltaic layer 212, the bandgap comprises about 2.27 eV.

In this regard, the light beam is either reflected or absorbed based on the state of the bandgap of the p-n junction, as well as the photonic energy of the light beam. As such, the photonic energy of the light beam is determined by:

$$E = \frac{hc}{\lambda} \quad (1)$$

where h is the Planck constant, c is the speed of light in a vacuum, and λ is a photon wavelength. In some aspects, the photon wavelength is about 532 nanometers, such that the photonic energy (E) of the light beam is about 2.32 electronvolts (eV). In this manner, in the reverse biased state, the photonic energy of the light beam is less than the bandgap of the p-n junction such that the light beam incident on the photovoltaic layer 212 is transmitted therethrough and reflected by the adjacent reflective layer 226 of the interface structure 210, i.e., 2.37 eV>2.32 eV. Conversely, in the unbiased state, the photonic energy of the light beam is greater than the bandgap of the p-n junction such that the photonic energy of the light beam incident on the photovoltaic layer 212 is captured and directed to the EHC 224 for storage, i.e., 2.27 eV<2.32 eV.

In some examples, the interface structure 210 defines multiple primary reflective interfaces. These interfaces include an interface of the fluid and a surface of the photovoltaic layer 212 on which the light beam is incident. An additional primary reflective interface is defined by an interface between an opposing surface of the photovoltaic layer 212 and the reflective layer 226 disposed adjacent to the photovoltaic layer 212, such that the light beam incident on the interface of the fluid and a surface of the photovoltaic layer is transmitted therethrough to and reflected by the reflective layer 226 at the interface of the surface of the photovoltaic layer and the reflective layer, where the photovoltaic layer 212 is in the transmission mode (i.e., where the switch 216 is in a first position). In this manner, some amount of the incident light beam reflects from the interface structure 210, which leads to the reflections constructively or destructively interfering with one another.

Now referring to the example arrangement illustrated in FIGS. 3A, 3B, FIG. 3A illustrates an arrangement 300 including an interface structure 302, control unit 304 including a switch 306 in a first position and, in some instances, also other components (e.g., processor, sensor(s), transducer), and an EHC 308. In some examples these components correspond to respective ones of the interface structure 210, control unit 214, switch 216 and EHC 224 of FIG. 2. In this example, the interface structure 302 includes a photovoltaic layer 302a (e.g., photovoltaic layer 212), and further includes a reflective layer 302b (e.g., reflective layer 226.)

As shown, for example, the switch 306 is a SPDT switch in electrical communication with the p-n junction of the photovoltaic layer 302a. The switch is controllable by the control unit 304, between two positions, in response to interaction of the photovoltaic layer 302a with a light beam 310, between a first position (FIG. 3A) and a second position (FIG. 3B) to electrically apply a voltage across the p-n junction of the photovoltaic layer 302a. In the first position, and as illustrated in FIG. 3A, the switch 306 is configured to apply a reverse bias voltage (e.g., 0.1 V-0.25 V) across the p-n junction of the photovoltaic layer 302a.

The arrangement 300 of FIG. 3A defines a reflective layer 302b, capable of reflecting the light beam 310 incident on the photovoltaic layer 302a when the switch 306 is in the first position. More particularly, at the first position of the switch 306, the voltage applied across the p-n junction of the photovoltaic layer 302a reverse biases the bandgap of the p-n junction such that the photonic energy of the incident light beam 310 is less than the biased bandgap. Accordingly, the incident light beam 310 is transmitted through the photovoltaic layer 302a and is incident on the reflective layer 302b for reflection back to a gateway node (e.g., 202, FIG. 2).

Notably, the first position of the switch 306 corresponds to a transmission mode of the photovoltaic layer 302a, such that the light beam 310 incident on the photovoltaic layer 302a transmitted therethrough to and reflected by the adjacent reflective layer 302b to a sensor (e.g., sensor 208, FIG. 2) of the gateway node.

Referring now to FIG. 3B, in the second position of the switch 306, no voltage is applied across the p-n junction such that the bandgap of the p-n junction is unbiased and the photonic energy of the incident light beam 310 is more than the biased bandgap. Accordingly, the photonic energy of the incident light beam 310 is captured by the photovoltaic layer 302a and directed to the EHC 308 for energy storage thereby, without reflecting the light beam. In this manner, the second position of the switch 306 corresponds to a recharging mode, with at least a portion of the terminal node 102, 204 being powerable with the switch 306 in the second position. Further, controlling the switch 306 between the first and second positions conveys a data stream associated with the reflected light beam 310 to the sensor of the gateway node, including data regarding environment properties about the arrangement 300 as determined by a sensor of the terminal node. In some aspects, the digital data stream takes the form of amplitude-shift keying (ASK) such as on-off keying (OOK) or PPM.

FIGS. 4A-4D illustrate exemplary embodiments of a terminal node, such as the terminal node described above in reference to FIGS. 2 and 3A, 3B, that is submersible within a fluid (e.g., water) and sinking in a proper orientation (i.e., an upright position).

Figure 4A:
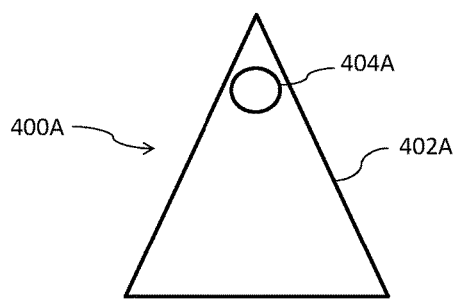
FIGS. 4A-4D illustrate suitable submersible terminal nodes according to example implementations of the present disclosure.

For example, in one example as shown in FIG. 4A, the terminal node 400A comprises a base structure 402A having a conical shape with a transparent exterior surface capable of receiving incident light therethrough and onto a photovoltaic layer and/or an adjacent reflective layer. In order to facilitate sinking of the terminal node and then maintain the terminal node 400A in an upright position, an orientation mechanism 404A in the form of an air bubble is disposed within the base structure 402A and rises towards the top of the base structure 402A as the terminal node 400A sinks within the fluid.

Figure 4B:
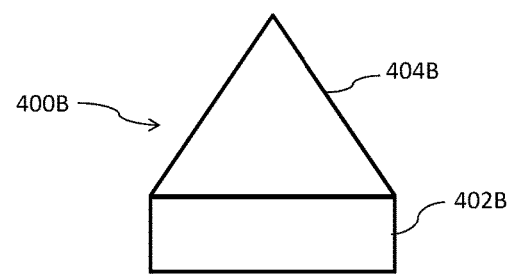

In another example, in the aspect shown in FIG. 4B, a terminal node 400B comprises a base structure 402B having a cylindrical or disk-like shape. In order to facilitate sinking of the terminal node and then maintain the terminal node 400B in an upright position, an orientation mechanism 404B in the form of a dissolvable cone is provided. In some aspects, the cone of the orientation mechanism 404B comprises an organic material that is dissolvable upon submersion in the fluid for an extended period of time. As the orientation mechanism 404B begins to dissolve, the base structure 402B is configured to settle itself about, for example, the ocean floor in order to maintain the terminal node 400B in the upright position.

Figure 4C:
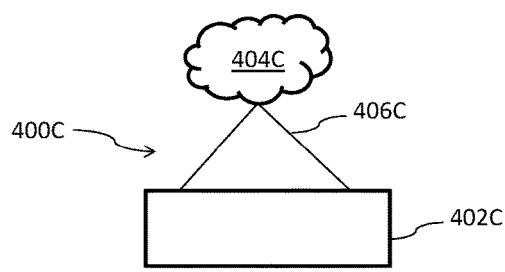

In a further example, in the aspect shown in FIG. 4C, a terminal node 400C comprises a base structure 402C having a cylindrical or disk-like shape. In order to facilitate sinking of the terminal node in an upright position, an orientation mechanism 404C in the form of an organic sponge material is attached via dissolvable lines 406C to the base structure 402C. More particularly, the orientation mechanism 404C acts as a type of parachute to maintain the base structure 402C in an upright position as the terminal node 400C is submerged and sinks within the fluid. Like the terminal node in FIG. 4B, the sponge-like material 404C and the lines 406C comprise an organic material that is dissolvable upon submersion in the fluid for an extended period of time.

Figure 4D:
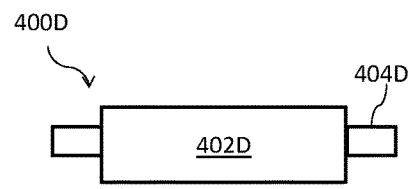

In a still further example, in the aspect shown in FIG. 4D, a terminal node 400D comprises a base structure 402D having a cylindrical or disk-like shape. In order to facilitate sinking of the terminal node in an upright position, an orientation mechanism 404D in the form of a ducted propeller, a centrifugal pump, a rudder, etc., is provided. More particularly, the orientation mechanism 404D acts as a type of fluid displacement mechanism to guide the terminal node 400D toward a bottom of, for example, the ocean.

In some aspects, the terminal nodes in FIGS. 4A-4D each comprise a coating disposed over an exterior surface of the terminal node, the coating being configured to prevent growth of organic material (e.g., algae) on the exterior surface of the terminal node. For example, a coating such as a copper coating, an epoxy based copper coating, a urethane based copper coating, a rosin based copper coating, and the like, having antimicrobial/algaecidal properties is usable to prevent growth of the organic material. Otherwise, a gateway node having a UV light source is used to halt growth of organic material when the gateway node passes over a submerged terminal node and the UV light is incident on the terminal node. Alternatively, the terminal node could have its own UV source to remove algae therefrom.

Figure 5:
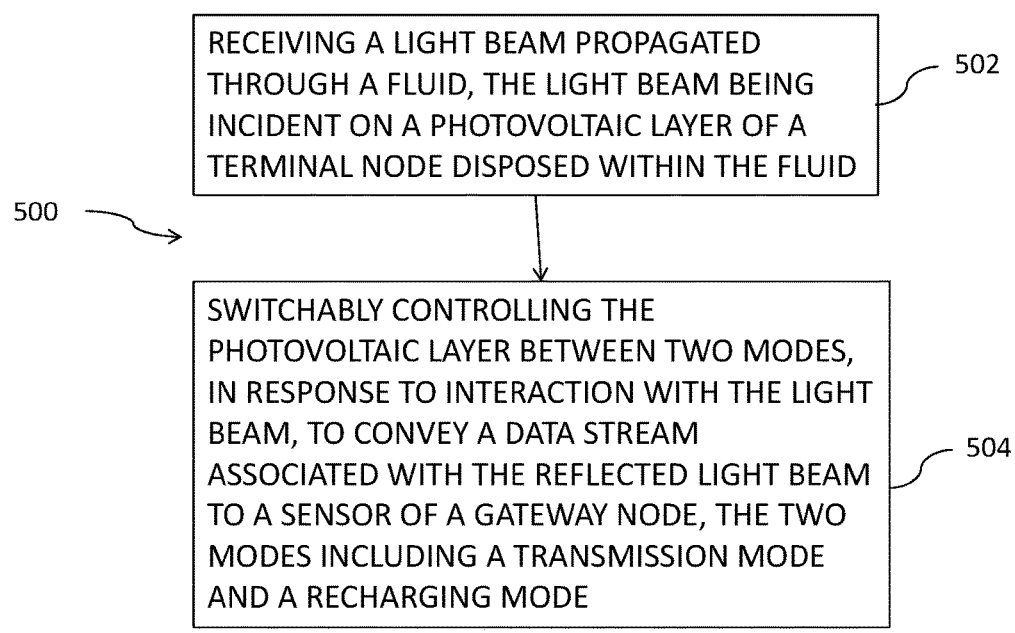
FIG. 5 illustrates a flowchart providing various steps in a method according to example implementations of the present disclosure.

Reference is now made to FIG. 5, which illustrates a flowchart illustrating various steps in a method 500 according to example implementations. As shown in block 502, the method includes receiving a light beam propagated through a fluid, the light beam being incident on a photovoltaic layer of a terminal node disposed within the fluid.

As shown in block 504, the method includes switchably controlling the photovoltaic layer between two modes, in response to interaction with the light beam, to convey a data stream associated with the reflected light beam to a sensor of a gateway node, the two modes including: a transmission mode, wherein the light beam incident on the photovoltaic layer is transmitted therethough to the reflective layer for reflection thereby, and wherein the reflected light beam is directed back through the photovoltaic layer to the sensor of the gateway node, and a recharging mode wherein the photovoltaic layer is configured to capture photonic energy from the light beam and to direct the captured photonic energy for storage by an energy source, without reflecting the light beam, and wherein at least a portion of the terminal node is powerable from the photonic energy stored by the energy source.

Many modifications and other implementations of the disclosure set forth herein will come to mind to one skilled in the art to which these disclosure pertain having the benefit of the teachings presented in the foregoing descriptions and the associated drawings. Therefore, it is to be understood that the disclosure are not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An information collection system, comprising:
   a gateway node including an actuator configured to produce a light beam for propagation through a fluid, and a sensor configured to detect a reflection of the light beam; and
   a terminal node disposed within the fluid and including an energy source and a photovoltaic layer adjacent to a reflective layer, the terminal node comprising a control unit configured to switchably control the photovoltaic layer between two modes, in response to interaction with the light beam, to convey a data stream associated with the reflected light beam to the sensor of the gateway node, the two modes including:
   a transmission mode wherein the light beam incident on the photovoltaic layer is transmitted therethrough to and reflected by the adjacent reflective layer to the sensor of the gateway node, and
   a recharging mode wherein the photovoltaic layer is configured to capture photonic energy from the light beam and to direct the captured photonic energy for storage by the energy source, without reflecting the light beam, at least a portion of the terminal node being powerable from the photonic energy stored by the energy source.

2. The system of claim 1, wherein the photovoltaic layer comprises a p-n junction having a bandgap of about 2.27 electronvolts, and wherein the light beam comprises a wavelength of about 532 nanometers.

3. The system of claim 2, wherein the control unit comprises a switch in electrical communication with the p-n junction of the photovoltaic layer and the energy source, the switch being controllable, in response to interaction of the photovoltaic layer with the light beam, between:
   a first position, corresponding to the transmission mode of the photovoltaic layer, wherein a voltage is applied across the p-n junction of the photovoltaic layer such that the photonic energy of the light beam is less than the bandgap, and wherein the light beam incident on the photovoltaic layer is transmitted therethrough to and reflected by the adjacent reflective layer, and
   a second position, corresponding to the recharging mode, wherein no voltage is applied across the p-n junction of the photovoltaic layer such that the photonic energy of the light beam is greater than the bandgap, and wherein the photovoltaic layer is configured to capture the photonic energy from the light beam and to direct the captured photonic energy for storage by the energy source.

4. The system of claim 3, wherein the voltage applied to the photovoltaic layer is between about 0.1 volts and about 0.25 volts, with the bandgap of the p-n junction being about 2.37 electronvolts.

5. The system of claim 1, wherein the terminal node comprises a sensor configured to determine a property of an environment about the terminal node and provide sensed data associated with the property, the data stream being configured to cooperate with the photovoltaic layer to carry the sensed data for modulating the light beam.

6. The system of claim 5, wherein the sensor of the terminal node is triggered to communicate with a sensor of at least one other terminal node disposed within the fluid, in response to interaction of the terminal node with the light beam.

7. The system of claim 1, wherein the terminal node comprises a coating disposed over an exterior surface of the terminal node, the coating being configured to prevent growth of organic material on the exterior surface of the terminal node.

8. A terminal node comprising:
   an energy source configured to store photonic energy and to power at least a portion of the terminal node from the photonic energy stored thereby;
   a reflective layer configured to reflect a light beam propagating through a fluid;
   a photovoltaic layer adjacent to the reflective layer; and
   a control unit in electrical communication with the photovoltaic layer to switchably control the photovoltaic layer between two modes, in response to interaction with the light beam, to convey a data stream associated with the reflected light beam to a sensor of a gateway node, the two modes including:
   a transmission mode wherein the light beam incident on the photovoltaic layer is transmitted therethrough to and reflected by the adjacent reflective layer to the sensor of the gateway node, and
   a recharging mode wherein the photovoltaic layer is configured to capture the photonic energy from the light beam and to direct the captured photonic energy for storage by the energy source, without reflecting the light beam.

9. The terminal node of claim 8, wherein the photovoltaic layer comprises a p-n junction having a bandgap of about 2.27 electronvolts, and wherein the light beam comprises a wavelength of about 532 nanometers.

10. The terminal node of claim 9, wherein the control unit comprises a switch in electrical communication with the p-n junction of the photovoltaic layer and the energy source, the switch being controllable, in response to interaction of the photovoltaic layer with the light beam, between:
    a first position, corresponding to the transmission mode of the photovoltaic layer, wherein a voltage is applied across the p-n junction of the photovoltaic layer such that the photonic energy of the light beam is less than the bandgap, and wherein the light beam incident on the photovoltaic layer is transmitted therethrough to and reflected by the adjacent reflective layer, and a second position, corresponding to the recharging mode, wherein no voltage is applied across the p-n junction of the photovoltaic layer such that the photonic energy of the light beam is greater than the bandgap, and wherein the photovoltaic layer is configured to capture the photonic energy from the light beam and to direct the captured photonic energy for storage by the energy source.

11. The terminal node of claim 10, wherein the voltage applied to the photovoltaic layer is between about 0.1 volts and about 0.25 volts, with the bandgap of the p-n junction being 2.37 electronvolts.

12. The terminal node of claim 8, wherein the terminal node comprises a sensor configured to determine a property of an environment about the terminal node and provide sensed data associated with the property, the data stream being configured to cooperate with the photovoltaic layer to carry the sensed data for modulating the light beam.

13. The terminal node of claim 8, wherein the terminal node comprises a coating disposed over an exterior surface of the terminal node, the coating being configured to prevent growth of organic material on the exterior surface of the terminal node.

14. The terminal node of claim 8, wherein the terminal node comprises a base structure and an orientation mechanism associated with the base structure, the orientation mechanism being configured to orient the terminal node about an environment thereof.

15. A method comprising:
receiving a light beam propagated through a fluid, the light beam being incident on a photovoltaic layer of a terminal node disposed within the fluid; and
switchably controlling the photovoltaic layer between two modes, in response to interaction with the light beam, to convey a data stream associated with the reflected light beam to a sensor of a gateway node, the two modes including:
a transmission mode, wherein the light beam incident on the photovoltaic layer is transmitted therethough to the reflective layer for reflection thereby, and wherein the reflected light beam is directed back through the photovoltaic layer to the sensor of the gateway node, and
a recharging mode wherein the photovoltaic layer is configured to capture photonic energy from the light beam and to direct the captured photonic energy for storage by an energy source, and wherein at least a portion of the terminal node is powerable from the photonic energy stored by the energy source, without reflecting the light beam.

16. The method of claim 15, wherein switchably controlling the photovoltaic layer comprises switchably controlling the photovoltaic layer comprising a p-n junction having a bandgap of about 2.27 electronvolts, in response to interaction thereof with the light beam comprising a wavelength of about 532 nanometers.

17. The method of claim 16, comprising controlling, in response to interaction of the photovoltaic layer with the light beam, a switch of the control unit in electrical communication with the p-n junction of the photovoltaic layer and the energy source, between:
a first position, corresponding to the transmission mode of the photovoltaic layer, wherein a voltage is applied across the p-n junction of the photovoltaic layer such that the photonic energy of the light beam is less than the bandgap, and wherein the light beam incident on the photovoltaic layer is transmitted therethrough to and reflected by the adjacent reflective layer, and
a second position, corresponding to the recharging mode, wherein no voltage is applied across the p-n junction of the photovoltaic layer such that the photonic energy of the light beam is greater than the bandgap, and wherein the photovoltaic layer is configured to capture the photonic energy from the light beam and to direct the captured photonic energy for storage by the energy source.

18. The method of claim 17, comprising applying a voltage across the p-n junction of between about 0.1 volts and about 0.25 volts, with the bandgap of the p-n junction being 2.37 electronvolts.

19. The method of claim 15, comprising determining a property of an environment about the terminal node, with a sensor of the terminal node, and providing sensed data associated with the property to the data stream, with the data stream cooperating with the photovoltaic layer to carry the sensed data for modulating the light beam.

20. The method of claim 19, comprising triggering communication of the sensor of the terminal node with a sensor of at least one other terminal node disposed within the fluid, in response to interaction of the terminal node with the light beam.

21. The method of claim 15, wherein switchably controlling the photovoltaic layer between the two modes, in response to interaction with the light beam, to convey the data stream associated with the reflected light beam to the sensor of the gateway node comprises conveying the data stream by modulating two bits per second.

* * * * *

UNITED STATES PATENT AND TRADEMARK OFFICE
CERTIFICATE OF CORRECTION

PATENT NO. : 10,009,119 B1
APPLICATION NO. : 15/451272
DATED : June 26, 2018
INVENTOR(S) : Nathan D. Hiller Page 1 of 1

It is certified that error appears in the above-identified patent and that said Letters Patent is hereby corrected as shown below:

In the Specification

At Column 8, Line 31, the text "a vacuum, and A is a photon wavelength." should be changed to -- a vacuum, and $\lambda$ is a photon wavelength. --

Signed and Sealed this
Second Day of October, 2018

Andrei Iancu
*Director of the United States Patent and Trademark Office*